United States Patent [19]

Neves et al.

[11] 4,262,235
[45] Apr. 14, 1981

[54] DEFLECTION AMPLIFIER

[75] Inventors: John C. Neves, Palo Alto; Ronald A. Gatten, San Jose, both of Calif.

[73] Assignee: American Optical Corporation, Southbridge, Mass.

[21] Appl. No.: 8,466

[22] Filed: Feb. 1, 1979

[51] Int. Cl.$^3$ .................. H01J 29/70; H01J 29/76
[52] U.S. Cl. ................................................ 315/397
[58] Field of Search ................... 315/396, 397, 403

[56] References Cited

U.S. PATENT DOCUMENTS

| | | | |
|---|---|---|---|
| 3,983,452 | 9/1976 | Bazin | 315/397 |
| 4,023,069 | 5/1977 | Peer | 315/397 |
| 4,054,816 | 10/1977 | Keidl | 315/397 |
| 4,119,891 | 10/1978 | Soldner et al. | 315/397 |

Primary Examiner—Theodore M. Blum

Attorney, Agent, or Firm—Jeremiah J. Duggan; Alan H. Spencer

[57] ABSTRACT

An improved drive for the deflection coil of a cathode ray tube. A first deflection, low-power supply means drives the deflection coil causing the electron beam to scan the face of the tube. A separate second deflection, high-power supply means drives the deflection coil causing retract of the beam. A switch means including a mono-stable multi-vibrator produces an output pulse of selected duration which controls a transistor switch connecting the second supply means to the deflection coil during the retrace cycle. A source of sync signals connected to the multi-vibrator produces the pulse input signals necessary to drive the multi-vibrator thereby controlling the timing of the transistor switch for causing retrace. The use of a separate second high power supply permits rapid retrace, improved power supply matching and minimal heat loss.

2 Claims, 5 Drawing Figures

DEFLECTION AMPLIFIER

BACKGROUND OF THE INVENTION

The present invention relates to an improved deflection amplifier used as a driver for high inductance loads. The present invention finds its application principally as an amplifier for driving deflection coils of cathode ray tubes. The amplifier is also useful in those systems where the signal applied to the inductive load is in the form of a saw-tooth wave.

The present invention, however, is to be distinguished from such systems wherein the driver for the deflection coils or inductive load is a resonance scan system or fly-back system such as is commonly utilized in conventional television sets. The resonance scan system or fly-back scan system of the common TV is a circuit which has become highly efficient since the early days of television. It will be recognized by those skilled in the art as including a deflection system including a capacitor and the yoke of the CRT (deflection coil) plus a power driver in the form of an amplifier. Advantage is taken of the natural resonance of the electrical circuit to provide for the deflection of the beam across the cathode ray tube and the "fly-back" of the beam to begin an additional or subsequent scan across the tube.

The principle advantages of these resonance scan systems are utilized in cathode ray tubes wherein a raster is provided on the tube face. In such applications wherein the required raster on the cathode ray tube is constant, as where the scan rate is held to a single value, such fly-back deflection systems are advantageously used.

The application of the present invention is in a cathode ray tube utilized as a display in a scanning electron microscope. In such a system, the scan rates may be varied for different magnifications to take advantage of other operating characteristics of the operating system (microscope) such as enhanced resolution at high magnification.

Alternative beam deflection systems known in the art are those which occur in vector writing systems. In such applications, the electron beam (of a cathode ray tube) is deflected from any one given position to another position by the driving of the appropriate current in the deflection coils. In these vector writing systems, the activity of the electron beam which is deflected is essentially nonrepetitive as the beam is caused to move from position to position on the face of the cathode ray tube. Thus, it should be realized that the advantages of the electronic symmetry of the resonance deflection systems cannot be advantageously used. Thus, these vector deflection systems require deflection amplifier drivers capable of generating requisite voltage to be applied to the yokes which control the beam so as to cause the beam to assume the requisite deflection according to the image desired on the screen. In these systems, it must be anticipated that the electron beam which is deflected may have to be driven from one side of the image device (CRT) to the other side. In most vector systems, the time available for the beam to be deflected is held to a minimum which requires, accordingly, the application of a large voltage on the deflecting inductor in order to accomplish the requisite deflection.

In any given deflection system, the deflection of the electron beam is accomplished by the electric field generated in the inductor. This field is effectively the product of the coil inductance and the current established within the inductor. Once these design parameters are established and the coil implemented into a system, field change is accomplished by a given voltage applied to the deflection coil, according to the well-known equation (1) below:

$$V = L\, (di)/(dt)$$

As is usual in electronic systems, the design parameters of the components are chosen on the basis of a "worse case" situation. Thus, the deflection coils are usually chosen so as to produce an electrical field sufficient to deflect the beam the furthest distance in the shortest anitcipated time.

In designing a deflection system for a CRT, the constraints for deflection power are usually the coil inductance and current rating for the yoke of the CRT. Once these parameters are established, the voltage to be placed on the coil is determined by the relationship of equation (1) above, namely, $V = L\,(di)/(dt)$, where V is the voltage necessary across the coil, L is the inductance in henris and $(di)/(dt)$ is the rate of change of current with respect to time.

In TV-type raster scanning, the $(di)/(dt)$ parameter becomes important during retrace time when the current in the coil has to reverse direction and return to a starting value in a relatively short period of time. During a retrace, in the application of equation (1) $(di)/(dt)$ is determined by the overall system requirements. As is recognized, the inductance L is fixed so the voltage V placed upon the coil has to comply in order to drive the current to the starting value.

FIG. 1 illustrates the typical current wave during a retrace and deflection period of a raster-type image on a CRT. In FIG. 1, $t_r$ represents the retrace time and $t_d$ represents the deflection time.

As the $(di)/(dt)$ is different for the retrace time $t_r$ and the deflection $t_d$ so is the requirement for the voltage between these two times different.

As was indicated in conventional deflection systems, the voltage supply is made large enough to meet the worse condition, explicitly, the retrace time $t_r$. The shortcoming of this approach is the power dissipation is unnecessarily high during the remaining portion of the circuit operation ($t_d$). During this period of time, the voltage requirement of the yoke is considerably less as may be seen from the much lower value of $(di)/(dt)$ from FIG. 1.

In the present invention, the voltage supply is conditioned to have two discrete values, one active for the retrace time $t_r$ and one active for the deflection $t_d$. This approach minimizes the overall power requirements of the deflection system since, during retrace only will the output of the higher voltage source be operational. The motivation for using a deflection scheme such as our present invention in such usual CRT instruments as commercial television receivers is not evident. Since, as indicated, the requirements of such television systems may be satisfied readily with a resonance type deflection system, the single scan rate requirements of comercial TV receivers together with the relatively low resolution requirement of the spot of the beam do not require large power drives or particularly accurate voltage supply systems. However, in the case of applications of the present invention in such as scientific instruments, the reverse is the case.

The present invention finds application in the display monitors of scanning electron microscope (American Optical Coates & Welter Division's SEM's Model).

It is usual in such systems that high resolution monitors are employed including such as a 3,000-line CRT. It should be recognized that in the utilization of such high resolution monitors that the requirements on the deflection system are much more severe than those in the conventional TV systems. Spot size is required to be maintained at the design parameter throughout the deflection over the full raster and stability of the raster is required to be maintained to a high degree of accuracy. It is also common to synchronize the scan of the electron beam in a cathode ray tube to the scan of the beam within the scanning electron microscope to ensure presentation of the image upon the cathode ray tube. It should be recognized that the present circuit finds utility in this application since the high current for quick retrace in the deflection control is exercised only cyclically during retrace, reducing power loss in the retrace supply during this period.

One of the principal advantages of the present invention in such instrument applications is the lower power requirements over all of the deflection system. In scientific instruments high capacity voltage supplies are power consuming and thus heat-generators. As is recognized with precision scientific instruments, it is imperative that operating temperatures of instruments be maintained stable and in many cases heat sinking is required. These requirements are found in scanning electron microscopes. The inclusion of fans or other cooling devices in such delicate scientific instruments often interject noise and other unwanted detractors to the overall performance. A substantial reduction in heat generation occurs by the inclusion of the present invention. Thus, the provision of a "cool" deflection system greatly reducing heat sinking requirements within the instrument has produced energy savings in addition to improved operational characteristics. A collateral benefit in the instrument is the further avoidance of expensive high compliance, high voltage supplies.

These and other advantages of the present invention will be apparent from the subsequent description of a preferred embodiment of the invention.

SUMMARY OF THE INVENTION

Among the certain features of the present invention is an improved amplifier driver for a high inductance load. The present invention is preferably embodied in the deflection drive of a cathode ray tube wherein a high level of response must be maintained and wherein there is a concern for minimization of heat dissipation.

In the present invention, the deflection amplifier includes a bi-stable, or dual voltage source for the deflection coils of the CRT, such that during the period of beam deflection across the face of the tube wherein the voltage/current demands are less, a low voltage source is operational. When retrace occurs, a high level voltage source is activated for the period of retrace to cause the beam to quickly and accurately return to the starting point of the deflection pattern.

Since the high voltage, and thus high power source is activated only during retrace, this aspect of the circuit is not producing heat/power during the long deflection period, which conserves energy and minimizes heat dissipation requirements.

The above and other objects of the present invention will be apparent from the following detailed description of a preferred embodiment.

DESCRIPTION OF A PREFERRED EMBODIMENT

Figure 1A:
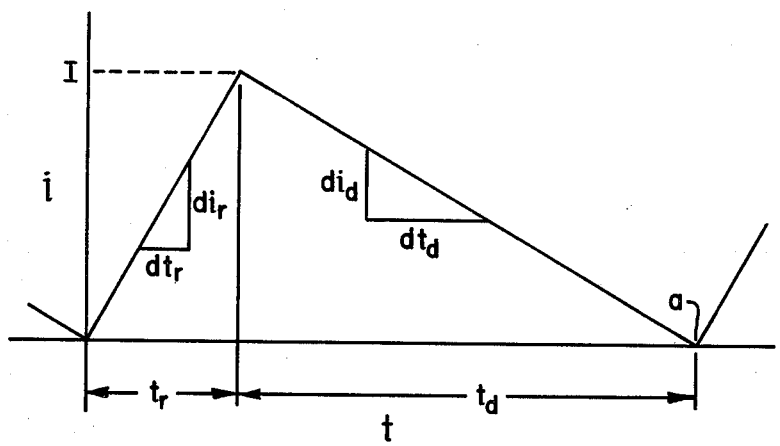
FIGS. 1a through c illustrate current waveforms during deflection and retrace of electron beams in cathode ray tubes.

Referring now to the drawings, an embodiment of the invention is described as implemented in a Model Scanning Electron Microscope available from American Optical Corporation. The described embodiment forms the principal circuit of the yoke deflection amplifier for the CRT monitor in that instrument.

As previously indicated, the curve illustrated in FIG. 1 represents the desired output of the drive circuit, namely, to the deflection coil of the CRT. On FIG. 1a, the value of current to the yoke coil is indicated on the ordinant reaching a maximum value during the retrace time $t_r$ which occurs during what conventionally is known as the fly-back time or retrace time. After reaching this value and being positioned in the retrace or initial starting position, the deflection coil current diminishes through the deflection time $t_d$ as further illustrated in FIG. 1a. At such time as which the electron beam completes its deflection trace across the cathode ray tube, a retrace phase again begins to bring the spot back. This is represented in the change in slope of the current curve as indicated at point a.

Figure 1B:
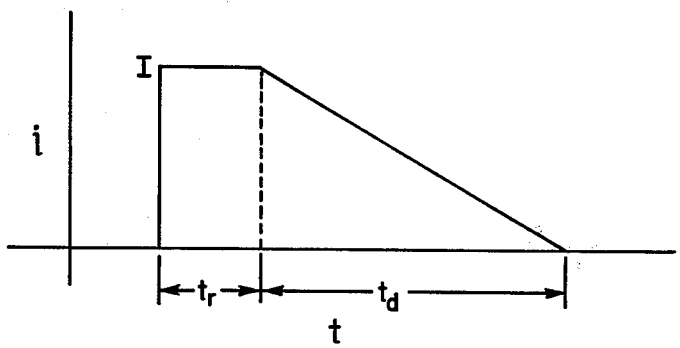

FIG. 1b illustrates the output current to a deflection coil for a "conventional" yoke drive wherein a single voltage source supply provides the current to drive the deflection coil. In this instance, the voltage supply necessarily has to have the full voltage capability to drive the deflection coil throughout the sequence retrace time and deflection time. As may be seen in the illustration in FIG. 1b, full supply voltage is applied during retrace time to cause the current to reach the maximum level in the shortest time possible within the constraints of the system. Once the retrace is completed, the electron beam is driven across the CRT face as is indicated by the continuously decreasing current curve during the deflection time $t_d$.

Figure 1C:
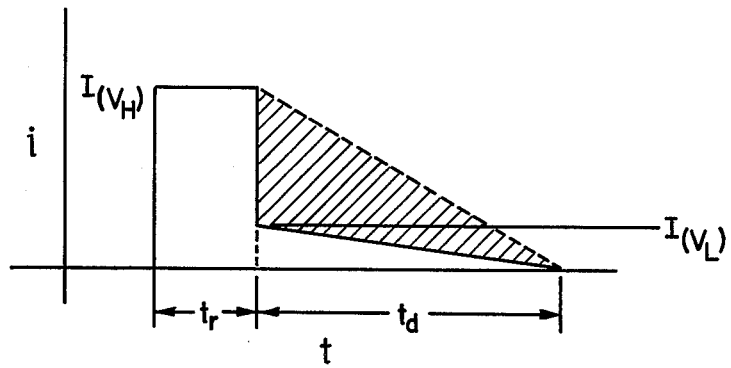

The present invention can be perhaps better understood through the illustration of FIG. 1c which shows the two level application of voltages to the deflection coil to accomplish individually (1) retrace of the electron beam and (2) deflection thereof across the CRT face. By separation of these functional voltage supplies, savings in power can be achieved. Voltage applied to the yoke is generally indicated according to the solid line of the curve of FIG. 1c. Because deflection of the electron beam can be accomplished with a relatively low voltage drive of the current to the deflection coil, the deflection current can take that form illustrated in FIG. 1c. The dotted line of the figure indicates the slope of the curve of the required current under the conventional situation leaving the shaded portion to illustrate the overall power savings in a retrace and deflection cycle according to the present invention.

Figure 2:
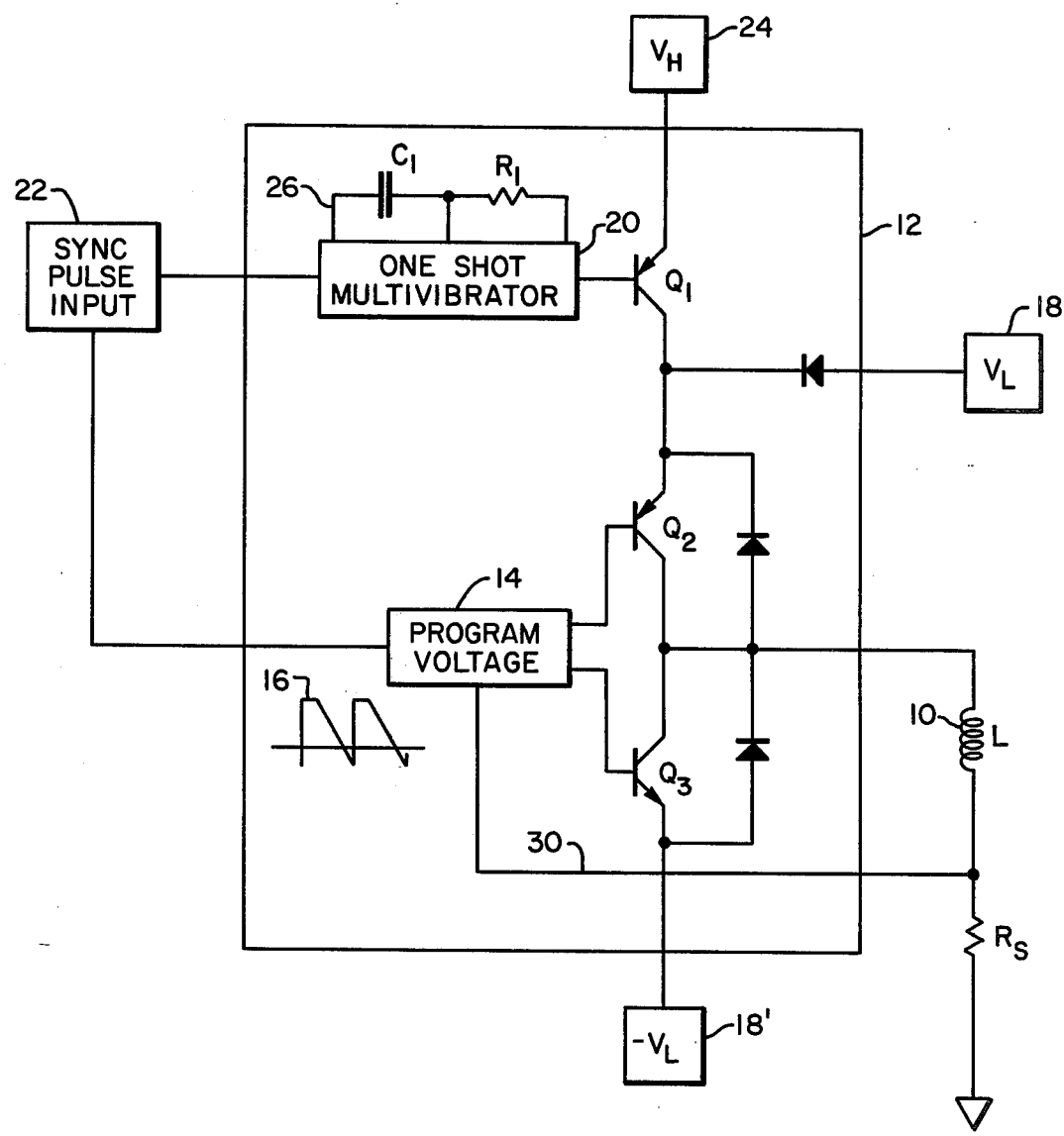
FIG. 2 is an electrical diagram illustrating the present invention.

The deflection coil is powered according to the present invention by a circuit as diagrammatically illustrated in FIG. 2. In this figure, the deflection coil is illustrated at 10 and forms the primary load of the deflection amplifier 12 illustrated in the drawing. The deflection amplifier according to the preferred embodiment takes the conventional push-pull form as is illustrated by the principal output transistors Q2 and Q3. These output transistors Q2 and Q3 are controlled via a program voltage from input 14 which cycles the transistors Q2 and Q3 to provide the requisite saw-tooth deflection voltage. This program voltage is generally of the conventional saw-tooth form and is illustrated in FIG. 2 adjacent the box 14 indicating the program voltage source. It should be noted in the illustrated program voltage a flat region 16 occurs in the saw-tooth. This flat portion of the input is provided to enable switching of the transistors when the high voltage input is applied. During the retrace phase of the yoke drive, this flat portion of the signal to the output transistors puts these transistors in the stable condition during this high voltage pulse to stabilize the output wave and avoid overshoots and other instabilities. As may be appreciated, the program voltage cycles Q2 and Q3 to provide positive and negative voltage from voltage sources 18 and 18' which are the plus and minus low voltage sources respectively.

At the completion of the deflection time $t_d$, a multivibrator 20 is fired by a sync pulse generator 22 which applies the high voltage from source 24 to be applied directly to the deflection coil 10. This application of the high voltage for retrace is accomplished through the sync pulse triggering a one-shot multivibrator which in turn, turns on the electronic switch Q1. The duration of this boosted voltage to accomplish retrace is controlled by the RC circuit 26 which is diagrammatically composed of capacitor C1 and resistance R1. Thus, once the timing circuit 26 shuts down the multivibrator 20, the electronic switch Q1 is returned to an off-state and the high voltage pulse is removed from the deflection coil. At this time, the low voltage sources 18 and 18' once again provide the normal deflection drive to the deflection coil 10. A feedback circuit 30 between the deflection coil 10 and a sensing resistor $R_s$ keeps the program voltage source apprised of the cycle state of the retrace deflection cycle to properly time the input of the sync pulse and coordinate the program voltage to output transistors Q2 and Q3.

Figure 3:
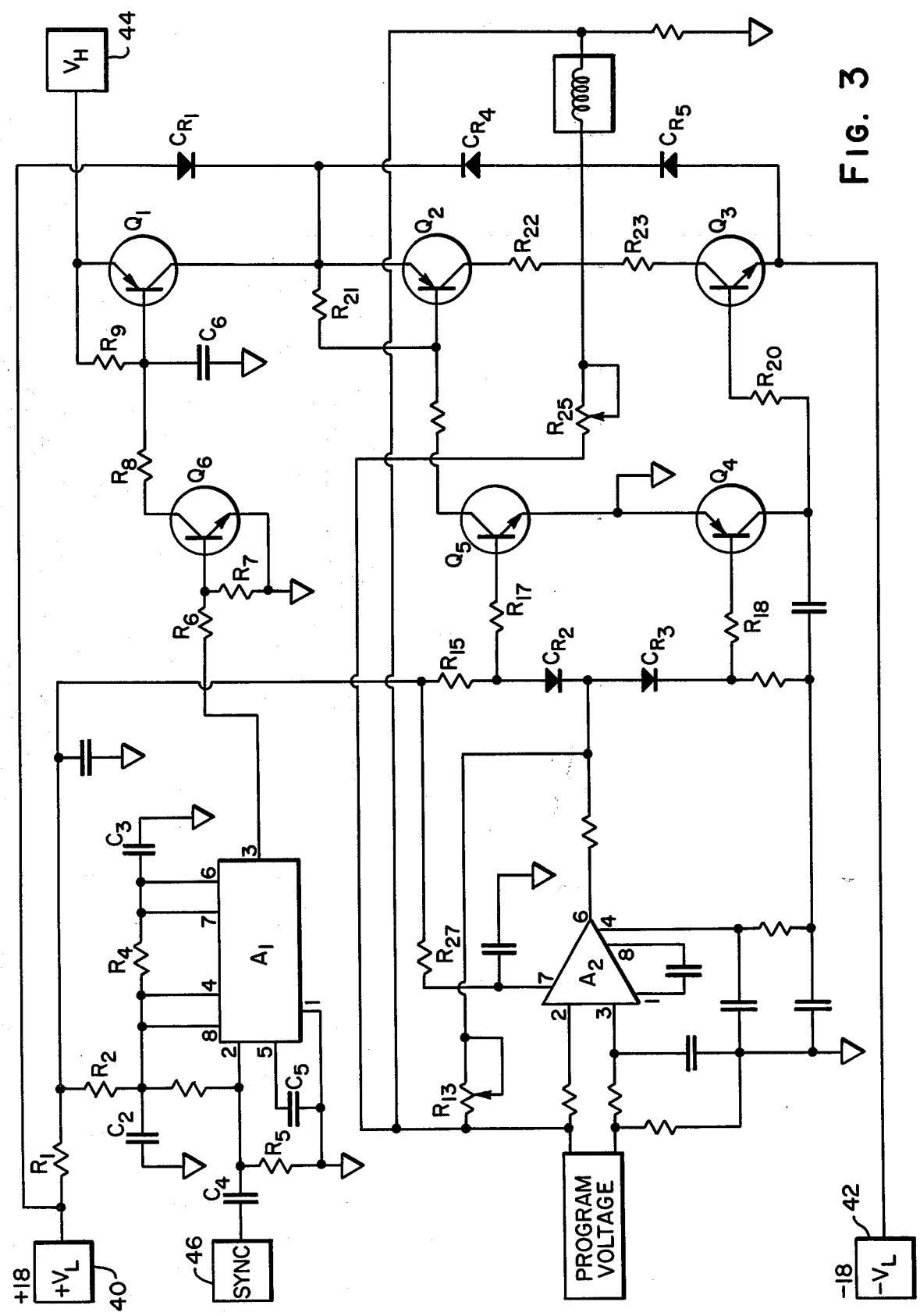
FIG. 3 is an electrical schematic of an embodiment of the present invention.

Referring now to FIG. 3, the present invention is illustrated as specifically embodied in a CRT yoke deflection amplifier in the above-identified American Optical Scanning Electron Microscope. In the illustrated embodiment, the low voltage supply of plus 18 volts is provided from a source 40. This low voltage is supplied to transistor Q2 through diode CRT and correspondingly, the opposite voltage, negative 18 volts, is supplied from source 42 to transistor Q3. These transistors and their respective sources make up the respective push-pull output amplifier. This low voltage, positive source 40 is also utilized to power the monostable multivibrator controlling the input from high voltage source 44. This low voltage is applied to amplifier A1 through resistor R1 and R2. Amplifier A1 receives a sync input at 46 and through various resistors and capacitors, as illustrated in FIG. 3, provides an output signal to transistor Q6 which in turn controls the switching of electronic switch Q1.

Operational amplifier A2 controls the output of output transistors Q2 and Q3 acting as the program coordinator. The program voltage is received from a source by amplifier A2 and in turn sequences switching transistors Q4 and Q5 to control output transistors Q2 and Q3. The figure illustrates the buffering and filtering components known in the art and required for stable operation of the amplifiers and switches shown. The electrical components of this schematic are identified in the following table:

$R_s$: 1.5 ohms
$R_1, R_{24}$: 25 ohms 3 W
$R_2, R_{14}, R_{26}, R_{27}$: 100 ohms
$R_3$: 2.4 kohms
$R_4, R_{17}, R_{18}$: 1 Kohms
$R_5, R_{15}, R_{16}, R_{21}$: 10 kohms
$R_6, R_{10}, R_{11}$: 2 Kohms
$R_7$: 470 ohms
$R_8$: 1.5 kohms ½ W
$R_9$: 15 ohms
$R_{12}$: 200 Kohms
$R_{13}$: 50 kohms, variable
$R_{19}, R_{20}$: 47 ohms
$R_{22}, R_{23}$: 0.1 ohm 3 W
$R_{25}$: 500 Kohms variable
All resistors ¼ W, 5% unless otherwise specified.
$C_1, C_9$: 4.7 mf, 35 v
$C_2$: 10 mf, 25 v
$C_3, C_4$: 220 pf
$C_5$: 0.01 mf 50 v
$C_6, C_7$: 680 pf
$C_8$: 5 pf
$C_{10}, C_{11}$: 1 mf
$Q_1, Q_2$: MJ 4502
$Q_3$: 2N 6249
$Q_4$: MPS U-60
$Q_5, Q_6$: MPS U-10
$CR_1$: 13YX71
$CR_2, CR_3$: 1N914
$CR_4, CR_5$: 1N4007
$A_1$: NE 555
$A_2$: CA 3100

While a particular embodiment of the invention has been shown and described, it would be obvious to those skilled in the art that changes and modifications may be made without departing from the invention in its broader aspects and therefor the aim in the appended claims is to cover all such changes and modifications as fall within the true spirit and scope of the invention.

We claim:

1. In a drive for the deflection coil of a variable rate raster-scanned cathode ray tube, the improvement comprising:
   first deflection supply means for driving the deflection coil of said cathode ray tube for causing movement of an electron beam across said cathode ray tube;
   second deflection supply means for driving said deflection coil of said cathode ray tube for causing retrace of said beam;
   switch means including a mono-stable multi-vibrator for producing an output pulse of selected duration, resistor-capacitor means associated with said mono-stable multi-vibrator for determining said selected duration and a transistor switch controlled by said output of said mono-stable multi-vibrator for connecting said second supply means to said deflection coil during retrace; and sync means connected to said mono-stable multi-vibrator causing said mono-stable multi-vibrator to produce said output pulse to have said transistor switch connect said second deflection supply means to said deflection coil to retrace.

2. The improvement according to claim 1 wherein said first deflection supply means includes a Class AB push-pull amplifier.

* * * * *